US011967973B2

(12) United States Patent
Abbasfar

(10) Patent No.: US 11,967,973 B2
(45) Date of Patent: Apr. 23, 2024

(54) LOW OVERHEAD TRANSITION ENCODING CODES

(71) Applicant: Samsung Display Co., Ltd., Yongin-si (KR)

(72) Inventor: Aliazam Abbasfar, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

(21) Appl. No.: 17/389,146

(22) Filed: Jul. 29, 2021

(65) Prior Publication Data

US 2022/0368342 A1 Nov. 17, 2022

Related U.S. Application Data

(60) Provisional application No. 63/185,190, filed on May 6, 2021.

(51) Int. Cl.
*H03M 7/12* (2006.01)
*H03M 5/12* (2006.01)
*H03M 13/00* (2006.01)

(52) U.S. Cl.
CPC .......... *H03M 5/12* (2013.01); *H03M 13/6502* (2013.01)

(58) Field of Classification Search
CPC ........ H03M 5/145; H03M 7/40; H03M 13/09; H03M 13/1102; H03M 13/23;
(Continued)

(56) References Cited

U.S. PATENT DOCUMENTS 3,906,485 A 9/1975 Hong et al.
4,027,335 A 5/1977 Miller
(Continued)

FOREIGN PATENT DOCUMENTS

| CN | 111201749 A | 5/2020 |
| GB | 2357408 A | 6/2001 |
| TW | 202011710 A | 3/2020 |

OTHER PUBLICATIONS

EPO Extended European Search Report dated Jun. 21, 2022, issued in corresponding European Patent Application No. 21216671.4 (12 pages).
(Continued)

*Primary Examiner* — Linh V Nguyen
(74) *Attorney, Agent, or Firm* — Lewis Roca Rothgerber Christie LLP

(57) ABSTRACT

A processing circuit configured to: receive original data; partition the original data into a plurality of original q-bit words; assemble a data packet including N original q-bit words from the plurality of original q-bit words; identify a first encoder value and a second encoder value that are absent from the values of the N original q-bit words; encode the N original q-bit words based on a one-to-one mapping from q-bit original values to q-bit encoded values based on the first encoder value and the second encoder value to generate N encoded q-bit payload words, the N encoded q-bit payload words being free of words that are all-zeroes and free of words that are all-ones; generate a key representing the first encoder value and the second encoder value; and transmit the key and the N encoded q-bit payload words.

19 Claims, 8 Drawing Sheets

(58) Field of Classification Search
CPC ............. H03M 13/2957; H03M 13/31; H03M
13/3761; H03M 13/458; H03M 13/6325;
H03M 13/6356; H03M 7/20; H03M
7/3071; H03M 7/425; H03M 7/46; H03M
7/48; H03M 7/6011; H03M 7/6041;
H03M 7/607; H03M 7/6094; H04L
25/4908; H04L 25/493; H04L 25/4906;
G06F 11/0793; G06F 11/08; G06F
11/1004
USPC .......................... 341/58, 59, 67, 68, 69, 70
See application file for complete search history.

(56) References Cited

U.S. PATENT DOCUMENTS

| | | | |
|---|---|---|---|
| 4,501,000 A | | 2/1985 | Immink et al. |
| 4,520,346 A | | 5/1985 | Shimada |
| 5,297,185 A | | 3/1994 | Best et al. |
| 5,550,864 A | | 8/1996 | Toy et al. |
| 5,589,829 A * | 12/1996 | Astle .................... H04N 19/126 |
| | | | 375/E7.14 |
| 5,696,505 A | | 12/1997 | Schouhamer Immink |
| 5,859,601 A | | 1/1999 | Moon et al. |
| 6,124,811 A * | 9/2000 | Acharya .................. H03M 7/46 |
| | | | 341/63 |
| 6,281,815 B1 * | 8/2001 | Shim ...................... G11B 20/14 |
| | | | 341/106 |
| 6,492,920 B2 | | 12/2002 | Oki et al. |
| 6,516,035 B1 * | 2/2003 | Wang .................... H03M 5/145 |
| | | | 375/253 |
| 6,653,952 B2 | | 11/2003 | Hayami et al. |
| 6,765,511 B2 | | 7/2004 | Hayami |
| 6,897,793 B1 | | 5/2005 | Kim et al. |
| 7,016,286 B2 | | 3/2006 | Hayami et al. |
| 7,084,788 B2 | | 8/2006 | Shim et al. |
| 7,142,135 B1 | | 11/2006 | Chen et al. |
| 7,224,296 B2 * | 5/2007 | Coene .................... H03M 5/145 |
| | | | 341/59 |
| 7,330,137 B2 | | 2/2008 | Liu |
| 7,432,834 B1 * | 10/2008 | Cideciyan ............. H03M 5/145 |
| | | | 341/59 |
| 7,436,331 B1 * | 10/2008 | Chaichanavong .... H03M 5/145 |
| | | | 341/94 |
| 7,667,626 B1 * | 2/2010 | Chaichanavong .... H03M 5/145 |
| | | | 341/59 |
| 7,680,269 B2 | | 3/2010 | Nicolai et al. |
| 9,166,769 B2 | | 10/2015 | Lee |
| 9,419,749 B2 | | 8/2016 | Luby et al. |
| 9,654,140 B1 * | 5/2017 | Klum ...................... G06F 21/62 |
| 9,729,681 B2 | | 8/2017 | Lee |
| 9,860,560 B2 * | 1/2018 | Pu .......................... H04N 19/70 |
| 10,476,664 B2 | | 11/2019 | Kuang |
| 11,323,247 B2 | | 5/2022 | Kuang |
| 2001/0040518 A1 | | 11/2001 | Coene |
| 2011/0299629 A1 * | 12/2011 | Luby ..................... H04L 1/0065 |
| | | | 375/299 |
| 2018/0205398 A1 | | 7/2018 | Shany et al. |
| 2019/0260388 A1 * | 8/2019 | Wegener ............... G06F 3/0608 |
| 2021/0152284 A1 | | 5/2021 | Handte et al. |

OTHER PUBLICATIONS

Taiwanese Office Action for TW Application No. 111102741 dated Feb. 6, 2024, 4 pages.

* cited by examiner

LOW OVERHEAD TRANSITION ENCODING CODES

CROSS-REFERENCE TO RELATED APPLICATION(S)

This application claims priority to and the benefit of U.S. Provisional Patent Application No. 63/185,190, filed in the United States Patent and Trademark Office on May 6, 2021, the entire disclosure of which is incorporated by reference herein.

FIELD

Aspects of embodiments of the present disclosure relate to systems and methods for implementing low overhead transition encoding in communication links.

BACKGROUND

In in electronic data communications such as in a serial data link, communications between a sender and a receiver may be synchronized using a clock recovery or clock-data recovery (CDR) process. For example, a receiver may generate a clock from an approximate frequency reference using a phase-locked loop (PLL) and then phase-align the generated signal to the transitions (between high signal levels and low signal levels) in the data stream using CDR. However, recovery of the clock signal can fail if the data run length (e.g., sequence of consecutive 1s or 0s) exceeds a particular length due to there being an insufficient number of transitions for the receiver to detect.

SUMMARY

According to one embodiment of the present disclosure, an encoder includes a processing circuit configured to: receive original data; partition the original data into a plurality of original q-bit words; assemble a data packet including N original q-bit words from the plurality of original q-bit words; identify a first encoder value D1 and a second encoder value D2 that are absent from the values of the N original q-bit words; encode the N original q-bit words based on a one-to-one mapping from q-bit original values to q-bit encoded values based on the first encoder value D1 and the second encoder value D2; to generate N encoded q-bit payload words, the N encoded q-bit payload words being free of words that are all-zeroes and free of words that are all-ones; generate a key representing the first encoder value D1 and the second encoder value D2; and transmit the key and the N encoded q-bit payload words.

According to one embodiment of the present disclosure, a decoder includes a processing circuit configured to: receive a key and N encoded q-bit payload words; decode a first encoder value D1 and a second encoder value D2 from the key; and decode the N encoded q-bit payload words based on a one-to-one mapping from q-bit encoded values to q-bit original values based on the first encoder value D1 and the second encoder value D2 to generate N decoded original q-bit words.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
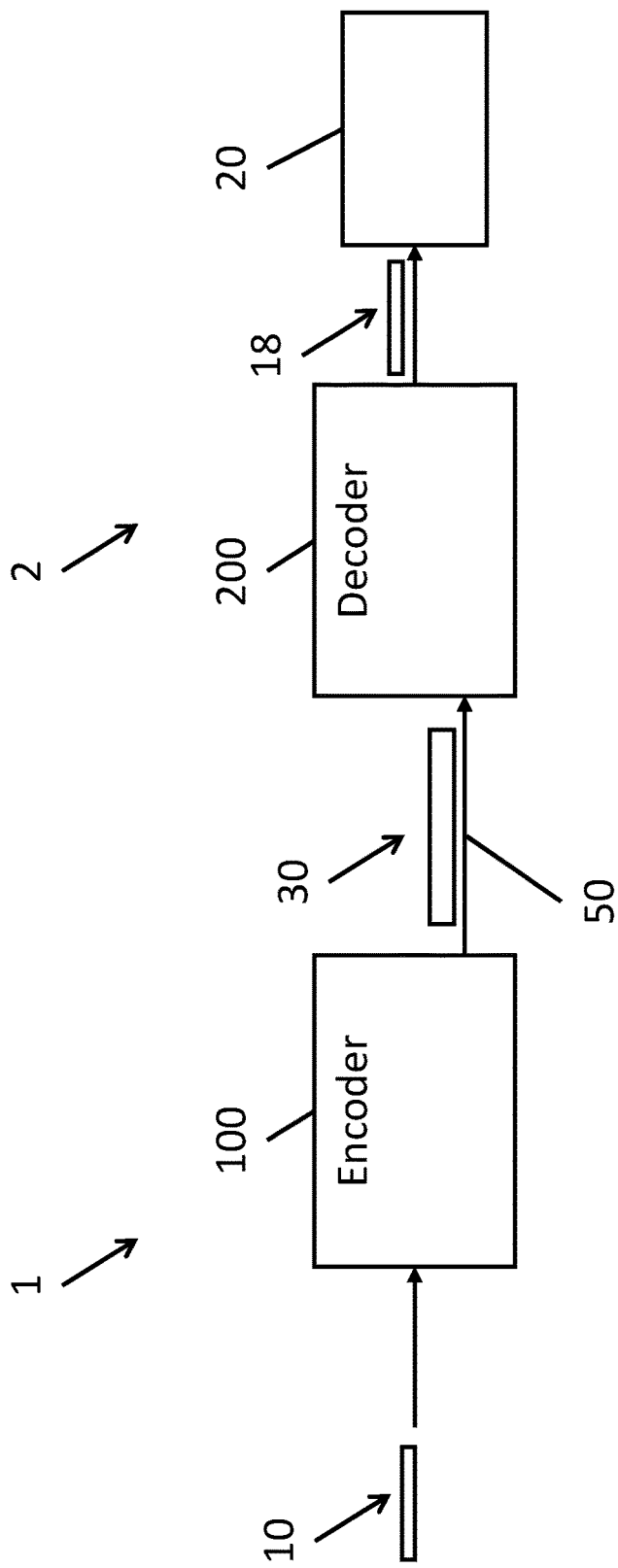
FIG. 1 is a schematic block diagram of a serial link between a sender and a receiver, the sender including an encoder in accordance with embodiments of the present disclosure and the receiver including a decoder in accordance with embodiments of the present disclosure.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to systems and methods for reducing or minimizing the run length of digital data in a communications system. In more detail, some aspects of embodiments of the present disclosure relate to systems and methods for encoding digital data to guarantee a limited run length or to guarantee that the run length of a packet of digital data is less than or equal to a particular limit in the form of run-length limited codes.

Aspects of embodiments of the present invention are directed to systems and methods for reducing or minimizing the run length of digital data.

According to one embodiment of the present disclosure, an encoder includes a processing circuit configured to: receive original data; partition the original data into a plurality of original q-bit words; assemble a data packet including N original q-bit words from the plurality of original q-bit words; identify a first encoder value D1 and a second encoder value D2 that are absent from the values of the N original q-bit words; encode the N original q-bit words based on a one-to-one mapping from q-bit original values to q-bit encoded values based on the first encoder value D1 and the second encoder value D2 to generate N encoded q-bit payload words, the N encoded q-bit payload words being free of words that are all-zeroes and free of words that are all-ones; generate a key representing the first encoder value D1 and the second encoder value D2; and transmit the key and the N encoded q-bit payload words.

The processing circuit may be configured to encode a q-bit original value x as a q-bit encoded value x' based on a comparison of the q-bit original value x with the first encoder value D1 and the second encoder value D2.

In some embodiments, the first encoder value D1 and the second encoder value D2 may have matching prefixes of length q−1, a computed value E may correspond to q−1 most significant bits of D1, and the processing circuit may be configured to generate the key, the key including the computed value E representing the first encoder value D1 and the second encoder value D2.

The processing circuit may be configured to encode a q-bit original value x as a q-bit encoded value x' by computing an exclusive or operation on the original value and the computed value E.

In some embodiments, a space of $2^q$ values of the q-bit original values may be divided into a plurality of groups, each group including a plurality of different consecutive q-bit original values, and the processing circuit may be configured to identify the first encoder value D1 and the second encoder value D2 by: identifying a group having two q-bit original values that are absent from the values of the values of the N original q-bit words; and identifying one of the two q-bit original values in the identified group as the first encoder value D1 and another of the two q-bit original values in the identified group as the second encoder value D2.

The space of $2^q$ values of the q-bit original values may be divided into G groups, and N may be less than or equal to $2^q$−G−1.

In some embodiments, each group may include up to three values, and the processing circuit may be configured to generate a computed encoder value E representing the first encoder value D1 and the second encoder value D2 by selecting a middle value of a group of the G groups that includes the first encoder value D1 and the second encoder value D2.

The processing circuit may be configured to encode a q-bit original value x as a q-bit encoded value x' based on a comparison of the q-bit original value x and the computed encoder value E.

In some embodiments, each group may include $2^r$ values, the first encoder value D1 and the second encoder value D2 may share q−r most significant bits, and the processing circuit may be configured to generate the key representing the first encoder value D1 and the second encoder value D2 by: encoding r least significant bits of D1 and r least significant bits of D2 using 2r−1 bits to generate a least significant bits code, the least significant bits code having at least one transition; and concatenating the q−r most significant bits with the least significant bits code.

The processing circuit may be further configured to generate the key representing the first encoder value D1 and the second encoder value D2 by dividing the q−r most significant bits into a first part and a second part, and the least significant bits code may be concatenated between the first part and the second part of the q−r most significant bits.

The processing circuit may be configured to transmit a data packet including: the N encoded q-bit payload words; and a header including the key.

According to one embodiment of the present disclosure, a decoder includes a processing circuit configured to: receive a key and N encoded q-bit payload words; decode a first encoder value D1 and a second encoder value D2 from the key; and decode the N encoded q-bit payload words based on a one-to-one mapping from q-bit encoded values to q-bit original values based on the first encoder value D1 and the second encoder value D2 to generate N decoded original q-bit words.

In some embodiments, the processing circuit may be configured to decode a q-bit encoded value x' to a q-bit decoded value x based on a comparison of the q-bit encoded value x' with the first encoder value D1 and the second encoder value D2.

The key may include a q−1 bit value E, the processing circuit may be configured to decode the first encoder value D1 by setting q−1 most significant bits of D1 to E and a least significant bit of D1 to 0, and the processing circuit may be configured to decode the second encoder value D2 by setting q−1 most significant bits of D2 to E and a least significant bit of D2 to 1.

The key may include a q−1 bit value E, and the processing circuit may be configured to decode a q-bit encoded value x' to a q-bit original value x based on a result of an exclusive or operation performed on the q-bit encoded value x' and the q−1 bit value E:

In some embodiments, a space of $2^q$ values of the q-bit original values may be divided into a plurality of groups, each group including a plurality of different consecutive q-bit original values, each group may include up to three values, and the processing circuit may be configured to decode the first encoder value D1 and the second decoder value D2 based on a result of a modulo operation on the q−1 bit value E.

The processing circuit may be configured to decode a q-bit encoded value x' to a q-bit original value x based on a comparison of the q-bit encoded value x' and the q−1 bit value E.

In some embodiments, a space of $2^q$ values of the q-bit original values may be divided into a plurality of groups, each group including $2^r$ different consecutive q-bit original values, the first encoder value D1 and the second encoder value D2 may share q−r most significant bits, and the processing circuit may be configured to decode the first encoder value D1 and the second encoder value D2 from the key by: reading an 2r−1 bit least significant bits code from the key; decoding the least significant bits code to first least significant bits and second least significant bits; reading q−r most significant bits from a portion of the key; concatenating the q−r most significant bits with the first least significant bits to decode the first encoder value D1; and concatenating the q−r most significant bits with the second least significant bits to decode the second encoder value D2.

The decoder may be configured to receive a data packet including: the N encoded q-bit payload words; and a header including the key.

FIG. 1 is a schematic block diagram of a serial link between a sender 1 and a receiver 2, the sender 1 including an encoder 100 in accordance with embodiments of the present disclosure and the receiver 2 including a decoder 200 in accordance with embodiments of the present disclosure. In the arrangement shown in FIG. 1, original data 10 is to be transmitted from the sender 1 to the receiver 2, where the original data 10 reconstructed by the decoder 200 as decoded data 18. The decoded data 18 may then be consumed by a data consumer 20. In more detail, the encoder 100 encodes the original data 10 into encoded data 30, and the encoded data 30 is transmitted over a data link 50 to the decoder 200. The decoder 200 then decodes the encoded data 30 to reconstruct the original data 18.

According to various embodiments of the present disclosure, the encoder 100 and the decoder 200 may, respectively, be referred to as an encoder circuit or encoder processing circuit and a decoder circuit or decoder processing circuit and may be implemented using various processing circuits such as a central processing unit (CPU), an application processor (AP) or application processing unit (APU), a field programmable gate array (FPGA), an application specific integrated circuit (ASIC) such as a display driver integrated circuit (DDIC), and/or a graphics processing unit (GPU) of one or more computing systems. For example, the encoder 100 and the decoder 200 may be components of the same computer system (e.g., integrated within a single enclosure, such as in the case of a smartphone, tablet computer, or laptop computer), may be separate components of a computer system (e.g., a desktop computer in communication with an external monitor), or may be separate computer systems (e.g., two independent computer systems communicating over the data link 50), or variations thereof (e.g., implemented within special purpose processing circuits such as microcontrollers configured to communicate over the data link 50, where the microcontrollers are peripherals within a computer system). As would be understood by one of skill in the art, the encoder circuit may be implemented using a different type of processing circuit than the decoder circuit. In addition, as would be understood to one of skill in the art, the various processing circuits may be components of a same integrated circuit (e.g., as being components of a same system on a chip or SoC) or may be components of different integrated circuits that may be connected through pins and lines on a printed circuit board.

As a concrete example, in the case of a data link 50 for controlling a display device, the sender 1 may include a graphics controller such as a graphics processing unit (GPU) or an application processing unit (APU) of a computer system (e.g., a laptop computer, a smartphone, a tablet computer, or the like) that generates image data as original data. This image data or original data 10 is then transmitted over a data link 50 to a display panel (e.g., a liquid crystal display panel or an organic light emitting diode display panel), which includes a decoder 200 for decoding the encoded data 30 into the decoded image data 18. The decoded image data 18 may then be supplied to a data consumer 20 such as processing circuits configured to convert the received decoded image data 18 into signals that control the display panel to display images (e.g., graphical user interfaces, video, and other display elements) as represented in the decoded image data 18.

In digital communications, a sender 1 and a receiver 2 can be synchronized using a clock recovery or clock-data recovery (CDR) process. A receiver using a CDR process typically operates by detecting the time of transitions between symbols on the physical layer of the data link (e.g., voltage levels of a signal on the link) and phase-aligning the clock of the receiver based on the detected transitions.

Figure 2:
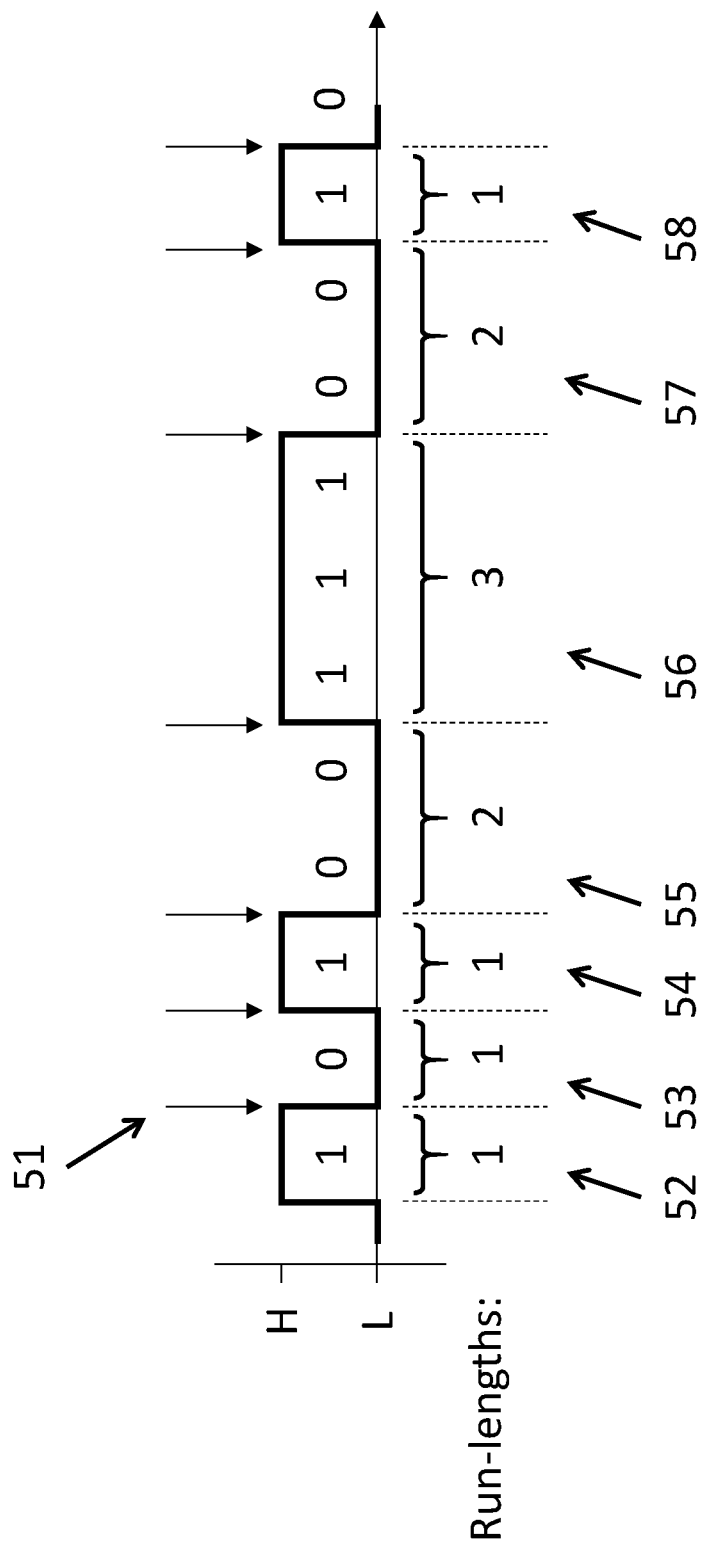
FIG. 2 is a depiction of binary data transmitted on a data link using a unipolar line code, where logical 1 values are encoded as logic-level high (H) signals and logical 0 values are encoded as logic-level low signals (L).

FIG. 2 is a depiction of binary data transmitted on a data link 50 using a unipolar line code, where logical 1 values are encoded as logic-level high (H) signals and logical 0 values are encoded as logic-level low signals (L). The logic-level high and logic-level low signals may be physically encoded on the data link as a high voltage (e.g., 5 volts or 3.3 volts) and a low voltage (e.g., 0 volts), respectively. In the example shown in FIG. 2, the data bit sequence 101001110010 is being transmitted over the data link 50. Transitions between logic-level low (L) and logic level high (H) voltages are shown by arrows 51. Stretches of repeated bits during which the signal does not change are referred to as runs. FIG. 2 specifically highlights seven different runs labeled 52, 53, 54, 55, 56, 57, and 58 along with their corresponding run-lengths. Based on the data bit sequence 101001110010, runs 52, 53, 54, 55, 56, 57, and 58 have corresponding run-lengths of 1, 1, 1, 2, 3, 2, and 1.

If the received signal contains an excessively long run length (e.g., a long sequence of data symbols having the same voltage level), the CDR process can fail due to there being an insufficient number of transitions in the received signal, which can cause problems in the recovery of the clock. For example, in a unipolar non-return-to-zero (NRZ) encoding, a logic-level high value (e.g., high voltage) may be used to encode a 1 and a logic-level low value (e.g., a low voltage) may be used to encode a 0. Directly encoding the values of any particular input data can result in arbitrarily long run lengths. For example, a long sequence of words that are all zeroes (0s) or a long sequence of words that are all ones (1s) would result in a signal being continuously at a logic-level low value or a logic-level high value, respectively, with no transitions between bits to use for CDR. While some problems arising from long run lengths are described above in the context of unipolar NRZ encoding, similar problems may occur in other types of modulation that may have more than two signal amplitude levels (e.g., pulse amplitude modulation or PAM, with more than two levels, such as PAM4 which uses four amplitude levels).

As such, aspects of embodiments of the present disclosure relate to systems and methods for encoding input data to generate encoded data bits, where the encoded data bits are guaranteed to have a limited run-length (e.g., a run length that is no longer than a particular limited number of bits). Limiting the run length of the data encoded in this way improves the ability of a decoder to perform CDR, thereby improving the quality of the communication link between the sender and the receiver. Aspects of embodiments of the present disclosure further relate to systems and methods for decoding the encoded data bits to recover the original input data.

More formally, aspects of embodiments of the present disclosure relate to guaranteeing a transition every K bits (e.g., limiting the run length) by using a line coding algorithm to encode the raw data or original data such that transitions occur regularly.

Figure 3:
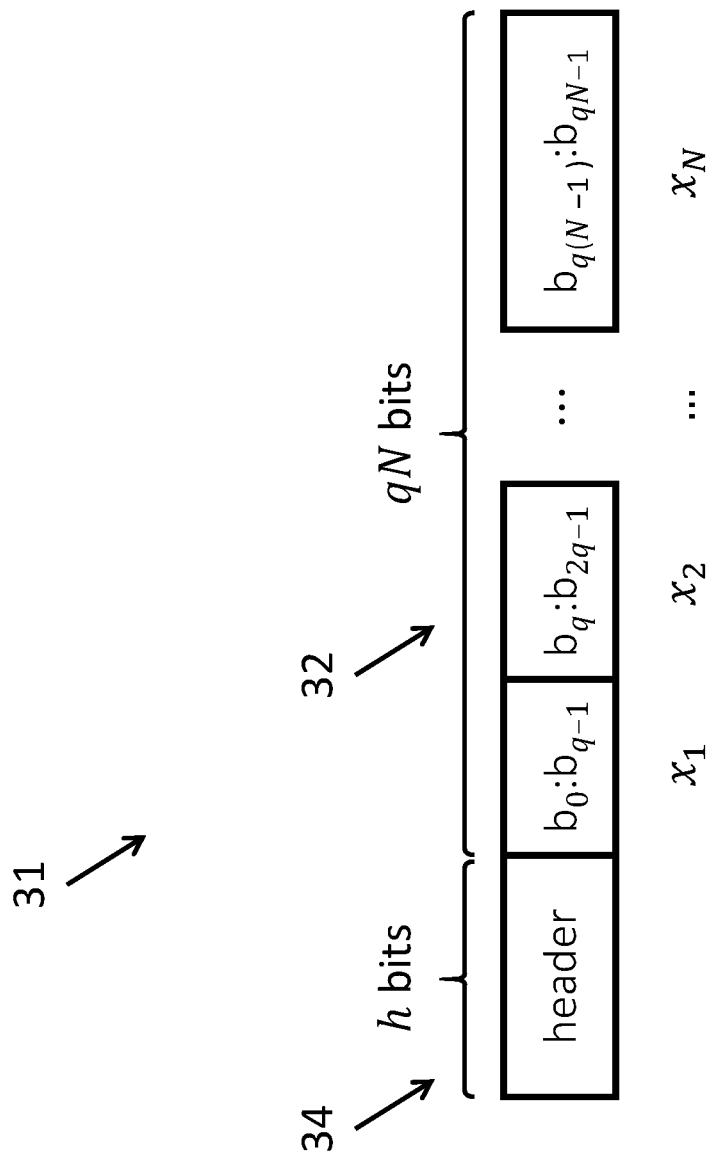
FIG. 3 is a schematic depiction of a data packet according to one embodiment of the present disclosure.

Some aspects of embodiments of the present disclosure relate to run-length limited codes where input data is encoded into one or more data packets, each data packet including a plurality of words. In the following description, each data packet includes N words (or up to N words), and where each word has q bits (in other words, each data packet may include up to N q-bit words). FIG. 3 is a schematic depiction of a data packet. Each data packet 31 may therefore be viewed as including a payload 32 of qN bits which may be numbered or indexed from 0 to qN−1, as in: b[0: qN−1]. Each q-bit word x may take on any value from 0 to $2^q-1$, and may also be represented as an array of q bits, e.g., b[0: q−1]. The payload 32 can therefore be viewed as N words that are concatenated together into an array of qN bits:

$x_1, x_2, \ldots, x_N$ $x_1$ (b[0: q−1]), $x_2$ (b[q: $2^q-1$]), ..., $x_N$ (b[q(N−1): qN−1])

For the sake of illustration, in the following examples, q is set to 6, such that each word is 6-bits long, with values in the range of 0 to 63. However, embodiments of the present disclosure are not limited thereto, and q may be set to other values such as 8, 10, 16, or the like, in accordance with design parameters and requirements of the encoding and decoding system and based on the application.

As shown in FIG. 3, the data packet 31 further includes a header 34 (having a length of h bits) representing additional overhead information that is transmitted as part of the encoded data packet 31 and that is used by the decoder 200 to decode the encoded data packet. The header 34 may include a key that contains information for decoding the encoded data packet.

One measure of the efficiency of an encoding scheme is based on dividing the number of payload bits (e.g., N words at q bits per word totals qN payload bits) by the total number of bits in the data packet 31 (e.g., sum of the number of payload bits qN and the number of header bits h). For example:

$$\text{Efficiency} = \frac{qN}{qN + h} \quad (1)$$

For the sake of simplicity, the discussion herein assumes that all h bits of the header are used by the key (e.g., the header does not also include additional information such as parity bits for error detection or error correction). However, embodiments of the present disclosure are not limited thereto and may also include circumstances where the header includes additional information.

In addition, while some embodiments of the present disclosure are described herein where the key is transmitted in a header of the data packet containing the N words of data (the qN payload bits) associated with the particular key, embodiments of the present disclosure are not limited thereto and, in some embodiments, the key is transmitted in a packet separate from the data packet 31 containing the payload bits.

Some aspects of embodiments of the present disclosure relate to ensuring that there is at least one transition in every word of the encoded data by ensuring that none of the words in the encoded data 30 are all-zeroes (e.g., q consecutive 0s) or all-ones (e.g., q consecutive 1s), such as 6'b000000 and 6'b111111 in the case where q=6. In other words, some aspects of embodiments of the present disclosure relate to eliminating all-zero and all-one words from the encoded data 30 or ensuring that the encoded data 30 does not include (e.g., is free of) words that are all-zeroes and does not include any words that are all-ones. By eliminating all-zero words and all-one words from the encoded data, the run length is limited to a worst case of 2(q−1) bits.

Figure 4:
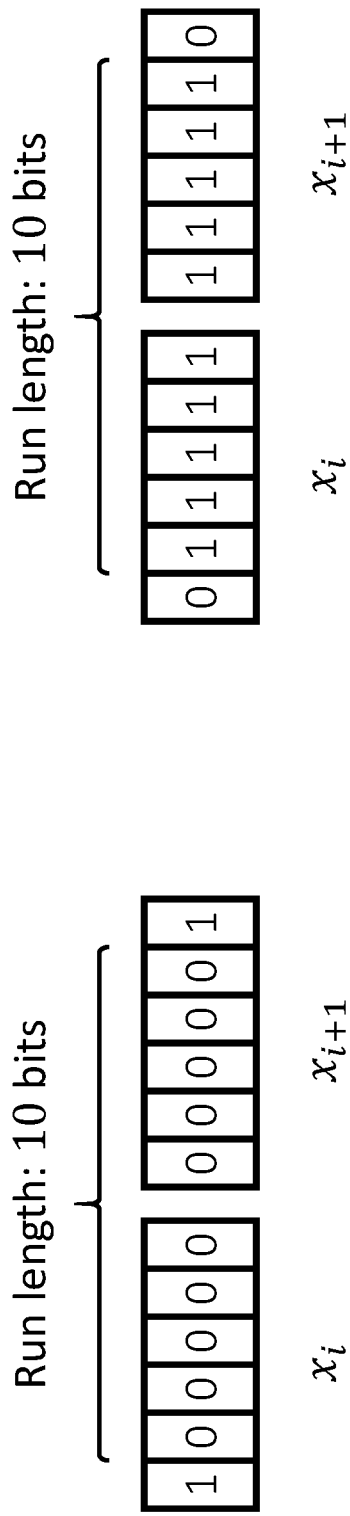
FIG. 4 is a schematic depiction of a maximum run length in an example scenario of a six-bit word (q=6) when data is encoded in a data packet in accordance with embodiments of the present disclosure.

FIG. 4 is a schematic depiction of a maximum run length in an example scenario of a six-bit word (q=6) when data is encoded in a data packet in accordance with embodiments of the present disclosure. As shown in FIG. 4, when the 6-bit word 6'b100000 (identified as word $x_i$) is followed by the 6-bit word 6'b000001 (identified as word $x_{i+1}$, then there is a run of ten 0s (2×(6−1)). Likewise, when the 6-bit word 6'b011111 is followed by the 6-bit word 6'b111110, then there is a run of ten 1s. Because the all-zero and all-one words have been eliminated, any other pairs of consecutive words will result in shorter run lengths than the limited maximum run length of 2(q−1) bits.

As such, aspects of embodiments of the present disclosure will be described in more detail below with respect to systems and methods for encoding original data 10 to generate encoded data 30 where the encoded data 30 is free of words that are all-ones or all-zeroes (e.g., none of the words has q 0s and none of the words has q 1s). In addition, aspects of embodiments of the present disclosure relate to systems and methods for decoding encoded data 30 to generate decoded data 18 matching the original data 10, which may include words that are all-ones and/or words that are all-zeroes.

Figure 5:
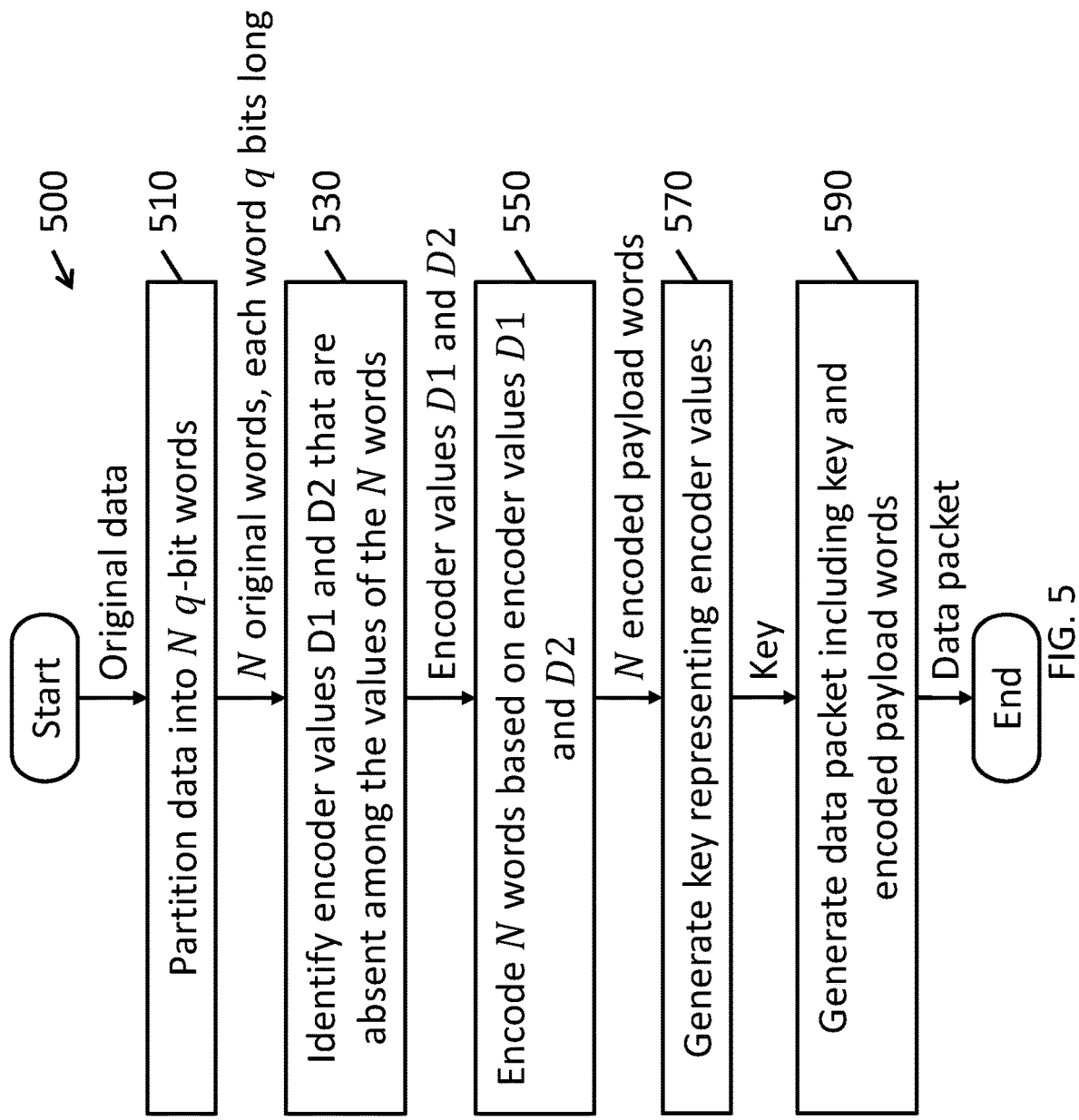
FIG. 5 is a flowchart depicting a method for encoding original data to generate a data packet according to one embodiment of the present disclosure.

FIG. 5 is a flowchart depicting a method 500 for encoding original data to generate a data packet according to one embodiment of the present disclosure. In some embodiments of the present disclosure, the operations of FIG. 5 are implemented in an encoder 100 configured to perform the operations described herein, such as being implemented in instructions stored in a memory and executed by a processor or processing circuit to implement the encoder 100 where the processor and memory may be components of a microcontroller, an application processor, a central processing unit, a digital signal processor, a field programmable gate array, an application specific integrated circuit, or the like.

Referring to FIG. 5, original data 10 is supplied to the encoder 100 from a data source (e.g., image data generated by a graphics processing unit). In operation 510, the encoder 100 partitions the original data 10 into a plurality of q-bit words. The number of bits q in each word x may be set in accordance with various design considerations, as discussed in more detail below. For the sake of convenience, the variable N will be used to refer to the number of words, such that operation 510 partitions the original data into N words, each word being q bits long for a total of qN bits. In cases where the original data 10 includes fewer than qN bits, additional padding bits may be added to the original data to reach a total of qN bits or there may be fewer than N words encoded in a particular data packet. If there are more than qN bits of original data, then the first qN bits of the original data 10 may be encoded in a first data packet, and subsequent bits of the original data 10 are encoded in subsequent data packets (e.g., the next qN bits of the original data 10 may be encoded in a second data packet, and so on).

In operation 530, the encoder 100 identifies two q-bit words that are absent from the N q-bit words that were partitioned from the original data in operation 510. A q-bit word may take on any of $2^q$ different values in the range from 0 to $2^q-1$. For example, a 6-bit word may take on any of 64 different values in the range from 0 to 63. Limiting the number of words N in a data packet guarantees that there exist at least two q-bit words that do not appear among the N q-bit words. For example, setting N to be less than or equal to $2^q-2$ provides such a guarantee (e.g., in the case of 6-bit words, setting N=$2^6$−2=62 words ensures that at least two values out of the 64 possible values of a 6-bit word will not appear among the 62 words). The two selected q-bit words will be referred to herein as encoder values D1 and D2, where D1<D2. Aspects of embodiments of the present disclosure relating to the selection of encoder values D1 and D2 will be described in more detail below.

In operation 550, the encoder 100 encodes original data 10 based on D1 and D2 to generate encoded payload data having N encoded payload words, where the encoded payload data does not include any words that are all-zeros or all-ones (without regard to whether the original N q-bit words contained any words that were all-zeroes or all-ones). Continuing the above example of 6-bit words, none of the N encoded payload words is b000000 and none of the N encoded payload words is b111111 (the N original words may or may not have included instances of b000000 and/or b111111).

In some embodiments, the encoder 100 encodes the original data based on a one-to-one mapping function between the original values and the encoded values.

Figure 6:
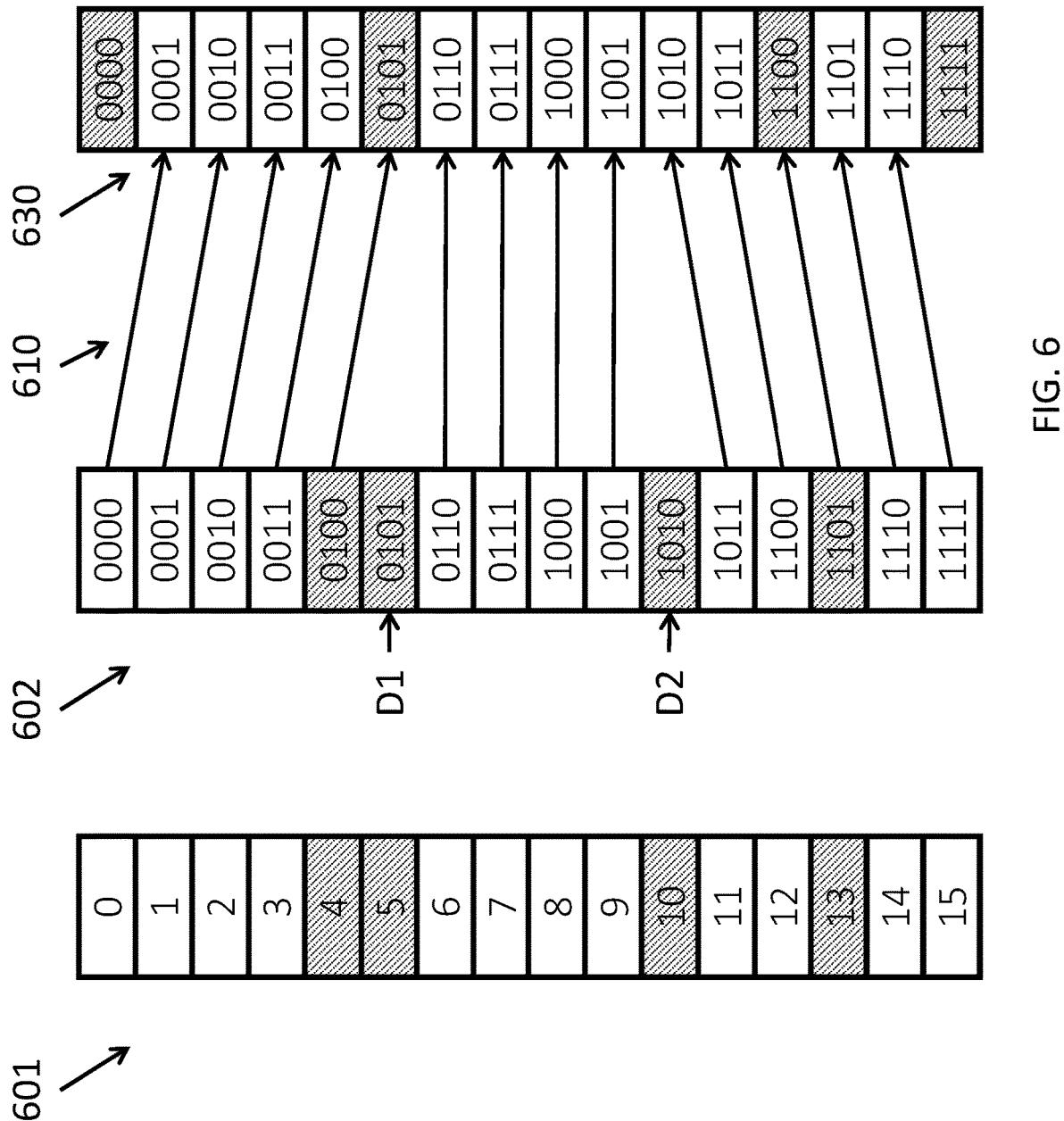
FIG. 6 shows a mapping of 4-bit values of original words in binary representations and decimal representations to corresponding encoded words based on encoder values according to one embodiment of the present disclosure.

FIG. 6 depicts the encoding of original data based on two encoder values D1 and D2 to generate encoded data according to one embodiment of the present disclosure. In some embodiments, the encoder 100 encodes the N original words by mapping the values of the words to encoded words in accordance with the following function enc(x) to encode original word x as encoded word x':

$$x' = enc(x) = \begin{cases} x+1 & x < D1 \\ x & D1 < x < D2 \\ x-1 & x > D2 \end{cases} \quad (2)$$

in other words, an original word x is incremented by one when its value is less than D1, kept the same (identity) when its value is between D1 and D2, and decreased by one when its value is greater than D2. (The cases where x=D1 or x=D2 do not need to be considered because, by construction, the values D1 and D2 do not appear among the N original words that are to be encoded.) This mapping ensures that the all-zeroes value does not appear in the encoded data, because all values less than D1 are incremented by one, thereby representing any all-zeroes values that appear in the N original words as the value 1 (e.g., b000001 in the case of q=6). Likewise, this mapping also ensure that the all-ones value does not appear in the encoded data because any all-ones values that appear in the N original words is represented as the second-to-highest possible value (e.g., b111110 in the case of q=6).

In the example shown in FIG. 6, q=4 (e.g., each word is 4 bits long), and the values 4 (4b0100), 5 (4b0101), 10 (4b1010), and 13 (4b1101) are absent from the original input data, which may be the bit sequence:

0001 0011 0110 1001 1000 0111 1111 1111 1111 0000 1110 1100 0010 1011

FIG. 6 shows a tables of all possible 4-bit values of the words in binary representations 601 and decimal representations 602 and indicates values that appear in the original data with white backgrounds while values that are absent from the original data are show with shaded backgrounds. For the sake of illustration, the value 4b0101 is selected as D1 and the value 4b1010 is selected as D2 from among the four candidate values. The encoding function or decoding mapping enc 610 maps from the values of the original data 602 to corresponding encoded values 630, as indicated by the arrows. As a result, the all-zeros value (4b0000) and the all-ones value (4b1111) is not used in the encoded version of the message. In particular, the encoded version of the above example original data would be:

0010 0100 0110 1001 1000 0111 1110 1110 1110 0001 1101 1011 0011 1010

As seen above, the encoded version of this original data does not include any all-zeroes values and does not include any all-ones values. In addition, the maximum run-length has decreased from 12 in the original data to the worst-case maximum run-length of 6 (e.g., 2(q−1)) in the encoded data.

In some embodiments, the encoder 100 encodes the N original words by mapping the values of the words to encoded words in accordance with the following function enc(x) to encode original word x into encoded word x':

$$x' = enc(x) = \begin{cases} D1 & x = \text{all zeroes} \\ D2 & x = \text{all ones} \\ x & \text{otherwise} \end{cases} \quad (3)$$

in other words, an original word x is mapped to D1 if it is the all-zeroes value (e.g., q consecutive 0s) and mapped to D2 if it is the all-ones value (e.g., q consecutive 1s). (Alternatively, in some embodiments, x is mapped to D1 if it is the all-ones value and mapped to D2 if it is the all-zeroes value) Otherwise, the encoded word has the same value as it had in the original word. Accordingly, the original bit sequence above:

0001 0011 0110 1001 1000 0111 1111 1111 1111 0000 1110 1100 0010 1011 may be encoded with the value 4b0101 is selected as D1 and the value 4b1010 is selected as D2 as:

0001 0011 0110 1001 1000 0111 1010 1010 1010 0101 1110 1100 0010 1011 by replacing each instance of 4b0000 with 4b0101 and each instance of 4b1111 with 4b1010.

In operation 570, the encoder 100 generates a header 34 representing the encoder values (e.g., D1 and D2), and in operation 590, the encoder 100 generates a data packet 31 including the header 34 and the N encoded payload words 32. The resulting data packet 31 may then be transmitted as encoded data 30 over data link 50 to decoder 200.

Figure 7:
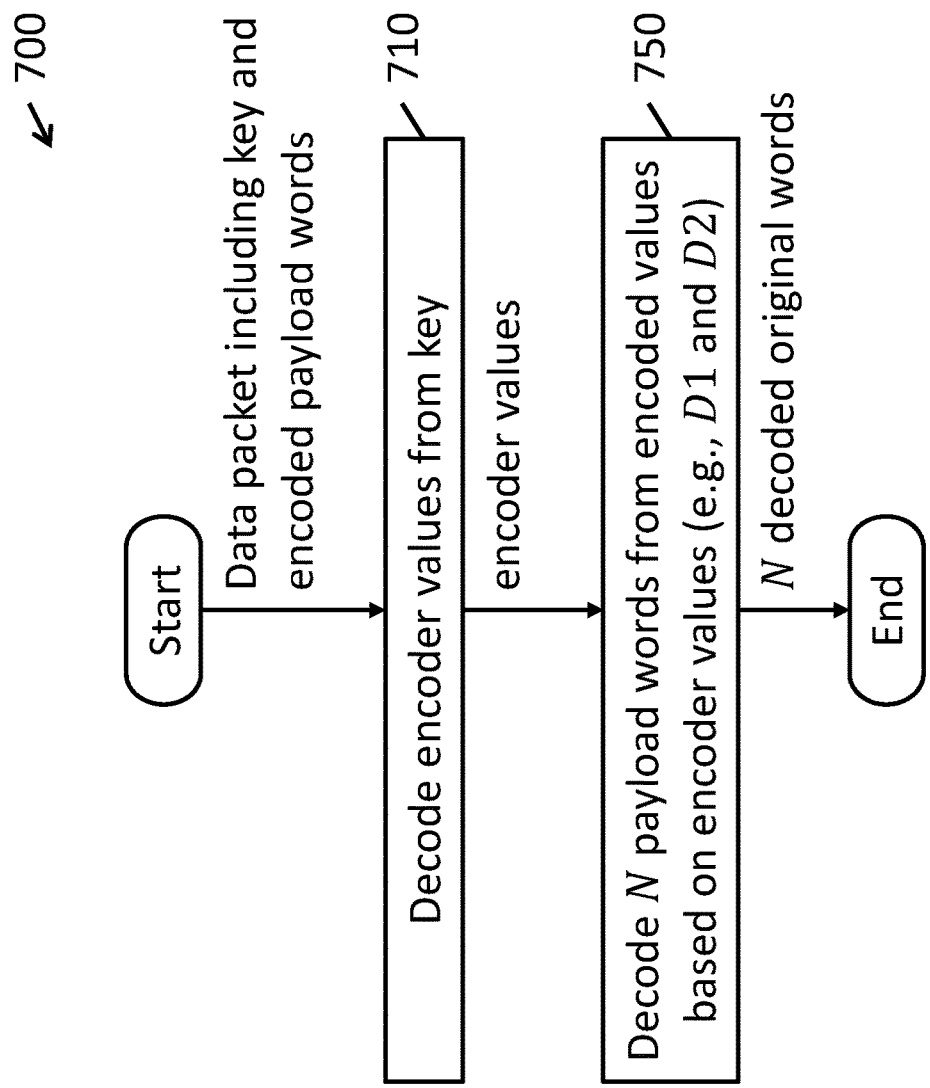
FIG. 7 is a flowchart depicting a method for decoding an encoded data packet according to one embodiment of the present disclosure.

FIG. 7 is a flowchart depicting a method for decoding an encoded data packet according to one embodiment of the present disclosure. The data packet 31 may include a header 34 and encoded payload words 32. As shown in FIG. 7, in operation 710 the decoder 200 reads the header from a received data packet (e.g., the data packet encoded by the encoder 100) to decode encoder values (e.g., D1 and D2) from the header. The encoder values D1 and D2 are used to determine a mapping from the encoded values of the encoded payload words to the decoded values of the original data.

In some embodiments, the decoder 200 decodes the N encoded words by mapping the values of the encoded words to decoded words in accordance with the following function dec(x') to decode encoded word x' to original word x:

$$x = dec(x') = \begin{cases} x' - 1 & x' \leq D1 \\ x' & D1 < x' < D2 \\ x' + 1 & x' \geq D2 \end{cases} \quad (4)$$

in other words, an encoded word x' is decremented by one when its value is less than or equal to D1, kept the same (identity) when its value is between first encoder value D1 and second encoder value D2, and incremented by one when its value is greater than or equal to D2. This mapping restores any all-zeroes values and any all-ones values that appeared in the original data.

Figure 8:
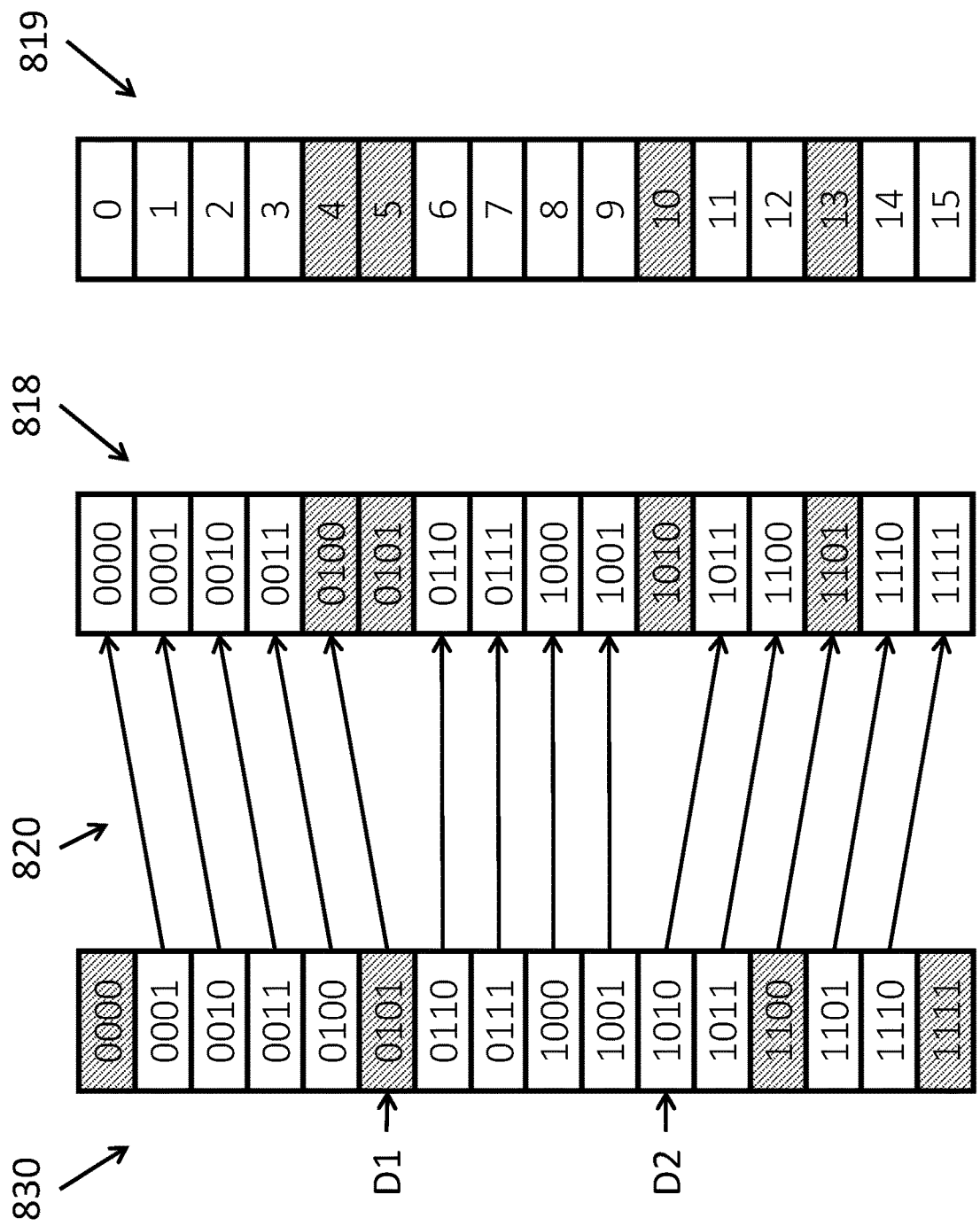
FIG. 8 shows a mapping of 4-bit values of encoded words to corresponding decoded words or original words based on encoder values according to one embodiment of the present disclosure.

FIG. 8 shows a mapping of 4-bit values of encoded words to corresponding decoded words or original words based on encoder values according to one embodiment of the present disclosure. As shown in FIG. 8, a decoding function or decoding mapping dec computes a mapping from encoded values 830 to reconstructed or decoded original values in binary representation 818 and also shown in decimal representation 819.

Similarly, in the case where the encoder enc performed a mapping in which instances of all-zeroes words (e.g., 4b0000) were replaced with D1 and instances of all-ones words (e.g., 4b1111) were replaced with D2, and all other values were kept the same, the decoding function or decoding mapping dec may be expressed as follows:

$$x = dec(x') = \begin{cases} \text{all zeroes} & x' = D1 \\ \text{all ones} & x' = D2 \\ x' & \text{otherwise} \end{cases} \quad (5)$$

As such, some aspects of embodiments of the present disclosure relate to systems and methods for encoding original data to limit the run-length in encoded data based on identifying unused values within the original data, selecting unused values as encoder values, and encoding the original data based on the encoder values. Aspects of embodiments of the present disclosure further relate to decoding encoded data based on the encoder values. Additional details regarding the selection of encoder values, the choice of the number N of words x in the data packet, and the number of bits q per word will be described in more detail below.

In the preceding discussion, aspects of the present disclosure were described in the context of an embodiment in which the number of words N in a data packet was constrained to less than or equal to $2^q-2$ to ensure that there are at least two values that did not appear among the N words so that the two absent or unused values could be used as the encoder values D1 and D2 of the encoding system. Because D1 and D2 could be any two values within the space of $2^q$ possible values, D1 and D2 would be transmitted in their entirety, without compression, as part of the header (as generated in operation 570), thereby resulting in 2q bits of overhead (q bits each for D1 and D2). As noted above, the efficiency of an encoding scheme may be given as:

$$\text{Efficiency} = \frac{qN}{qN+h}$$

In this case, h=2q, so:

$$\text{Efficiency} = \frac{qN}{qN+2q}$$

More concretely, in the case of q=6 and N=$2^q-2$, this is:

$$\frac{6*(2^6-2)}{6*(2^6-2)+2*6} = 96.875\%$$

Some aspects of embodiments of the present disclosure relate to the selection of the number of words N in a data packet and the number of bits q in a word that enables further improvements in efficiency, such as by decreasing the number of header bits (or overhead bits) that are used to represent the encoder value or encoder values for decoding the encoded values per word in the N-word data packet 31.

In more detail, some aspects of embodiments of the present disclosure relate to reducing the number of overhead bits used to transmit the encoder values (e.g., D1 and D2) through compression to fewer than 2q bits. For example, if D1 and D2 are chosen so that they have common prefixes (or most significant bits), then both values can be transmitted in the header using fewer bits. More generally, some aspects relate to grouping the $2^q$ possible values of q-bit words based on common prefixes (or common most significant bits) and choosing a number of words N in a data packet such that two unused values (e.g., values that are absent from the original data to be encoded) are in the same group. This enables selecting the two unused values that fall in the same group as the encoder values D1 and D2 and the encoding of these two encoder values D1 and D2 based on an identifier associated with the group (or a group identifier), where this encoding of the encoder values D1 and D2 uses fewer than 2q overhead bits. A data packet of N words will have two unused values that fall in the same group when N≤$2^q$–G–1, where the space of $2^q$ values of the q-bit values is divided into G groups.

Some example embodiments presented in more detail below relate to encoding schemes where: N=30, q=6 with 5-bit overhead (97.3% efficiency); N=40, q=6 with 6-bit overhead (97.6% efficiency), N=47, q=6 with 7-bit overhead (97.6% efficiency), and N=55, q=6 with 8-bit overhead (97.6% efficiency), although embodiments of the present disclosure are not limited thereto. For example, embodiments of the present disclosure may be implemented with words of lengths other than 6 bits, such as q=8.

In one embodiment of the present disclosure, the space of possible values for q-bit original words x is divided into groups of two consecutive values (pairs of values). For example, group 0 may include values 0 and 1, group 1 may include values 2 and 3, group 2 may include values 4, and 5 (in general, group k includes values 2k and 2k+1). Because each group contains consecutive values having shared prefixes e.g., may share q–1 most significant bits), the two values of each group differ only in their least significant bit. Therefore, when D1 and D2 fall within the same group, then both the first encoder value D1 and the second encoder value D2 can be encoded using q–1 bits. This is guaranteed to be true in the case where N≤$2^q$G–1. Accordingly, in these embodiments of the present disclosure, in operation 530 the encoder 100 identifies two encoder values D1 and D2 that fall within the same group.

Table 1, below, provides one example in the case where q=6:

TABLE 1

| Group identifier E | D1, D2 | overhead (5 bits) |
|---|---|---|
| 0 | 0, 1 | 00-000/11-111 |
| 1 | 2, 3 | 00-001 |
| 2 | 4, 5 | 00-010 |
| ... | ... | ... |
| 30 | 60, 61 | 11-110 |
| 31 | 62, 63 | Invalid |

In Table 1 above, all of the 5-bit overhead or key representing the groups include at least one transition, with the exception of group 0, which can be represented either as 00-000 or 11-111 (the '-' characters are included for readability). In order to provide some transition when transmitting the key representing group 0, an encoder according to some embodiments of the present disclosure determines whether to represent group 0 using 00-000 or 11-111 based on the value of the bit transmitted immediately before the key in order to result in a transition. For example, if the bit that is to be transmitted immediately before the key is a 1, then the encoder uses 00-000 as the key indicating group 0, where as if the bit transmitted prior to the key is 0, then the encoder uses 11-111 to indicate group 0. However, because 00-000 and 11-111 are both used to represent group 0, there is no corresponding remaining key to represent group 31. However, there is no need to use D1=62 and D2=63. In particular, when N<=30, there is always another pair D1 and D2 that can be selected instead (which can be proven by contradiction). Accordingly, no key is needed to represent group 31, which is indicated in Table 1 as "Invalid."

In the case where q=6 and N=30, each group can be identified using 5 bits, and therefore, with D1 and D2 falling within the same group, the efficiency may be calculated as:

$$\text{Efficiency} = \frac{qN}{qN+h} = \frac{6*30}{6*30+5} \approx 97.3\%$$

In these embodiments of the present disclosure, the encoder 100 may implement an encoding function or a mapping from original values to encoded values in operation 550 using the techniques described above (e.g., based on Equation (2) or Equation (3)) or equivalents thereof.

In addition, in some embodiments of the present disclosure where D1 and D2 differ only in their least significant bit (e.g., D1=6b010010 and D2=6b010011), the encoder 100 encodes the original data in operation 550 as follows: A value E is computed based on D1, where E is D1 divided by 2 (or, equivalently, a right shift by 1):

$$E = \frac{D1}{2} = D1[q-1:1]$$

For the case where q=6:

$$E = \frac{D1}{2} = D1[5:1]$$

The computed value E is then used to encode an original word x into a corresponding encoded word x' based on E:

$$x'=enc(x)=\{XOR(XOR(x[q-1:1],E),\{(q-1)\{x[0]\}\}),x[0]\} \quad (6)$$

where $\{(q-1)\{x[0]\}\}$ indicates the bit value at x[0] replicated q−1 times. For the case where q=6:

$$x'=enc(x)=\{XOR(XOR(x[5:1],E),\{5\{x[0]\}\}),x[0]\}$$

where $\{5\{x[0]\}\}$ indicates the bit value at x[0] replicated 5 times.

The (q−1)-bit value E is generated in the header in operation 570, where the (q−1)-bit value E represents the group that contains both selected encoder values D1 and D2. The encoder 100 then generates a data packet 31 including the header 34 (containing the (q−1)-bit value E) and the encoded payload data in operation 590. The resulting data packet 31 may then be transmitted to a receiver 2 which uses a configured decoder 200 to decode the encoded payload data 32 in the data packet 31.

In particular, in these embodiments, in operation 710, the decoder 200 determines a group based on the (q−1)-bit value E in the header 34 of the data packet 31. Because the group contains only two values, these values are taken by the decoder 200 as the values D1 and D2, and thereby used to determine the mapping used by the decoder (e.g., in accordance with Equations (4) or (5) as discussed above) to decode the encoded payload words in operation 750.

In embodiments using an XOR encoding as shown in Equation (6), above, a similar XOR operation is performed at the decoder 200 in operation 750 based on the encoder value E transmitted in the header:

$$x=dec(x')=\{XOR(XOR(x'[q-1:1],E),\{(q-1)\{x'[0]\}\}),x'[0]\} \quad (7)$$

In the specific case where q=6:

$$x=\{XOR(XOR(x'[5:1],E),\{5\{x'[0]\}\}),x'[0]\}$$

According to another embodiment of the present disclosure, the values are arranged into groups of three consecutive values. For example: group 0 may identify values 0, 1, and 2; group 1 may identify values 3, 4, and 5; and so forth. Accordingly, the encoder 100 computes a q-bit value E (e.g., when generating the header in operation 570) that is used to identify both a group and which two values within the group correspond to the encoder values D1 and D2 in accordance with:

$$E = \begin{cases} D1+1 & \text{if } D2-D1=2 \\ D1 & \text{if } \bmod(D1,3)=0 \\ D2 & \text{otherwise} \end{cases} \quad (8)$$

Intuitively, this may be thought of as E representing the middle value of the group. In particular, by construction, D1≤E≤D2. If D2−D1=2 (in the case of the middle row of each group in Table 2, below), then E is the middle value (E=D1+1=D2−1). In the case of the row above this, D1=E and D2=E+1 (this is when D1 is a multiple of 3). In the row below, we have D1=E−1 and D2=E.

In these embodiments, the encoder 100 may be configured to perform the mapping or encoding from the original words x to the encoded words x' in operation 550 using, for example, Equation (2) or Equation (3), above. In these embodiments, the encoding approach of Equation (2) may be simplified as follows based on the value E:

$$x' = enc(x) = \begin{cases} x+1 & \text{if } x < E \\ x & \text{if } x = E \\ x-1 & \text{if } x > E \end{cases} \quad (9)$$

Table 2, below, provides an example of the mappings of values to groups and their corresponding overhead for the case where q=6:

TABLE 2

| Group identifier | D1, D2 | overhead (6 bits) |
| --- | --- | --- |
| 0 | 0, 1 | 000-000 |
| 0 | 0, 2 | 000-001 |
|  | 1, 2 | 000-010 |
| 1 | 3, 4 | 000-011 |
|  | 3, 5 | 000-100 |
|  | 4, 5 | 000-101 |
| ... | ... | ... |
| 20 | 60, 61 | 111-100 |
|  | 60, 62 | 111-101 |
|  | 61, 62 | 111-110 |
| 21 | 63, x | 111-111 |

In some embodiments of the present disclosure using this coding arrangement, the decoder 200 is configured to decode the encoder values from the header containing the q-bit value E as follows in operation 710:

$$(D1, D2) = \begin{cases} (E, E+1) & \text{if } \bmod(E,3)=0 \\ (E-1, E+1) & \text{if } \bmod(E,3)=1 \\ (E-1, E) & \text{if } \bmod(E,3)=2 \end{cases} \quad (10)$$

The decoder 200 may then decode encoded values into original values as described above with respect to Equations (4) and (5). In addition, the decoding in accordance with Equation (4) may be simplified in this case to:

$$x = \begin{cases} x' - 1 & \text{if } x' \leq D1 \\ x' & \text{if } x' = E \\ x' + 1 & \text{if } x' \geq D2 \end{cases} \quad (11)$$

In the case of 6-bit words (q=6), this arrangement allows the use of up to $2^6-22-1=43$ words per data packet. Therefore, in the case where q=6 and N=43, each group can be identified using 6 bits, and therefore, with D1 and D2 falling within the same group of three values, the efficiency may be calculated as:

$$\text{Efficiency} = \frac{qN}{qN+h} = \frac{6*43}{6*43+6} \approx 97.7\%$$

According to some embodiments of the present disclosure, the space of possible values of the q-bit words is divided into groups of $2^r$ values, such that the values in each group share a common prefix up until the r least significant bits (e.g., the values may share the q−r most significant bits such that the q−r most significant bits are the same in each of the values). For example, when r is set to 2, then the space of possible values of the q-bit words is divided into groups of four values, such that the values in each group share a common prefix up until the two least significant bits (e.g., the first q−2 bits are the same). In some embodiments, the two selected values from within the group are encoded using 2r−1 additional bits.

Table 3, below, provides one example in the case where q=6 and r=2:

TABLE 3

| Group identifier | x (in decimal) | x (in binary) |
|---|---|---|
| 0 | 0 | 0000-00 |
|   | 1 | 0000-01 |
|   | 2 | 0000-10 |
|   | 3 | 0000-11 |
| 1 | 4 | 0001-00 |
|   | 5 | 0001-01 |
|   | 6 | 0001-10 |
|   | 7 | 0001-11 |
| ... | ... | ... |
| 15 | 60 | 1111-00 |
|   | 61 | 1111-01 |
|   | 62 | 1111-10 |
|   | 63 | 1111-11 |

As such, a group can be identified using the q−2 bits (e.g., the q−2 most significant bits or MSB) that are unique to each group. The two values within a group that correspond to D1 and D2 differ at the remaining 2 bits (e.g., the 2 least significant bits or LSB) and this pair of values is identified in some embodiments using three additional bits, such as by using the below Table 4:

TABLE 4

| D1, D2 (2 LSBs decimal) | D1, D2 (2 LSBs binary) | LSBs code (3 bits) |
|---|---|---|
| 0, 1 | 00, 01 | 001 |
| 0, 2 | 00, 10 | 010 |
| 0, 3 | 00, 11 | 011 |
| 1, 2 | 01, 10 | 100 |
| 1, 3 | 01, 11 | 101 |
| 2, 3 | 10, 11 | 110 |

In the particular encoding scheme shown above, the codes (e.g., the 3 bit codes) used to encode the least significant bits of the encoder values D1 and D2 within a group are designed such that they each include at least one transition (e.g., none of these codes is a string of three consecutive 0s or a string of three consecutive 1s). This is possible because the number of possible pairings of D1 and D2 is smaller than the number of bits used to encode this pair (e.g., 3 bits are used to encode 6 different possibilities, where 3 bits is capable of encoding $2^3$ possible values). On the other hand, q−2 bits used to identify the groups may contain, for example, q−2 consecutive 0s or q−2 runs of consecutive 1s. In such a case, merely concatenating the q−2 bits used to identify a group with the 3 bits used to identify the encoder values D1 and D2 within the group can cause a run of q consecutive 0s or q consecutive 1s. For example, in the case where q=6, if the group identifier is 0000 and the LSBs code is 001 (identifying D1 and D2 as the values with LSBs 00 and 01, per Table 4), then concatenating 0000 with 001 results in the header 0000001, which includes a run of 6 consecutive 0s. A similar problem may occur when the group identifier is 1111 and the LSBs code is 110, resulting in a run of 6 consecutive 1s. Therefore, in some embodiments, the group identifier is split into two parts (e.g., its higher order bits and its lower order bits) and the LSBs code is placed between the two parts. Continuing the example where q=6, the higher order bits that are common to D1 and D2 may be identified as D1[5:2] (e.g., the bits in positions 5 through 2 of D1 or, equivalently, of D2 as in D2[5:2]) These four higher order bits may be divided into a first part: D1[5:4] and a second part D1[3:2], and the LSBs code may be placed between these two parts, as in:

{D1[5:4], LSBs code, D1[3:2]}

As noted above, the LSBs codes are designed such that each includes at least one transition. Therefore, by placing the LSBs code in between the two parts, the maximum run length of the header is ((q−2))/2+2. For example, in the case of a group identifier of 0000 and the LSBs code of 001 above, the header is encoded as 0000100, which results in a run of four consecutive 0s.

The decoder 200 decodes, the first encoder value D1 and the second decoder value D2 in operation 710 by reading the most significant bits (e.g., D1[5:4] concatenated with D1[3:2]) and reading the least significant bits code (LSBs code) from the header, then decoding the LSBs code to (e.g., based on the table, above) to determine the least significant bits of D1 and the least significant bits of D2. The most significant bits read from the header are then concatenated with the decoded least significant bits of D1 to decode the full first encoder value D1, and the most significant bits read from the header are then concatenated with the decoded least significant bits of D2 to decode the full second encoder value D2.

Using this encoding scheme, the overhead is q−2 bits to identify the group plus 3 bits to identify the two selected members of the group, which totals h=q+1 bits. For example, in the case of q=6, the overhead is 7 bits. In this case of q=6, a valid D1 and D2 can be guaranteed to be found among the groups when N≤47 (e.g., up to $2^6-16-1=47$ words per data packet. Therefore, in the case where q=6 and N=47, each group can be identified using 7 bits, and therefore, with D1 and D2 falling within the same group of four values, the efficiency may be calculated as:

$$\text{Efficiency} = \frac{qN}{qN+h} = \frac{6*47}{6*47+7} \approx 97.6\%$$

In these embodiments, the encoder and the decoder may be implemented in a manner similar to that described above. For example, in some embodiments of the present disclosure using this coding arrangement, the decoder 200 is configured to decode the encoder values from the header containing the q-bit values D1 and D2 in accordance with Equations (2) or (3). Similarly, the decoder 200 may then decode encoded values into original values as described above with respect to Equations (4) or (5).

As another example, in some embodiments of the present disclosure where r=3, the space of possible values is divided into groups of eight consecutive values. For example, group 0 may include the values 0 through 7, group 1 may include the values 8 through 15, and so on. In this arrangement, the values within each group share a common prefix of q−3 bits and may differ only in their three least significant bits. Table 5, below, provides one example in the case where q=6 and r=3 and where, as an example, the value 9 is selected as D1 and the value 11 is selected as D2. These rows corresponding to D1 and D2 are shown in bold in Table 5, below.

TABLE 5

| Group | x | x (bits) | y = x^D1 | x' = f(y) |
|---|---|---|---|---|
| 0 | 0 | 000-000 | 001-001 | 001-001 |
|  | 1 | 000-001 | 001-000 | 001-000 |
|  | 2 | 000-010 | 001-011 | 110-110 |
|  | ... |  |  |  |
|  | 7 | 000-111 | 001-110 | 110-011 |
| 1 | 8 | 001-000 | 000-001 | 000-001 |
| D1 | 9 | 001-001 | 000-000 | 000-000 |
|  | 10 | 001-010 | 000-011 | 111-110 |
| D2 | 11 | 001-011 | 000-010 | 111-111 |
|  | ... |  |  |  |
|  | 15 | 001-111 | 000-110 | 111-011 |
| 7 | 56 | 111-000 | 110-001 | 110-001 |
|  | 57 | 111-001 | 110-000 | 110-000 |
|  | 58 | 111-010 | 110-011 | 001-110 |
|  | 63 | 111-111 | 110-110 | 001-010 |

In a manner similar to that described above, two values within a group of eight values can be uniquely identified with a LSBs code is 5 bits long (e.g., there are 28 ways to choose two values out of a set of eight possible values, and therefore 5 bits ($2^5$=32) is sufficient to specify any of those 28 possible pairs of two values, leaving room in the LSBs code to exclude the all-zeroes and all-ones runs of five bits). As such, in some embodiments, the values D1 and D2 are encoded using the code:

{LSBs code, MSBs}

For example, in the case where q=6, this may be expressed as:

{LSBs code, D1[5:3]}

In some embodiments, the MSBs are split into two parts and the LSBs code is placed between the two parts of the MSBs, in a manner similar to that described above. For example, in the case where q=8, the MSBs may be split into a first part with the first three bits (D1[7:5]) and a second part with the next two bits (D2[4:3]). As such, this may be expressed as:

{D1[7:5], LSBs code, D1[4:3]}

At the decoder 200, in operation 710 the first encoder value D1 and the second encoder value D2 may be decoded from the header in a manner similar to that described above for the case of r=2 (e.g., by reading the MSBs, decoding the LSBs from the LSBs code using the table, and concatenating the MSBs with the two decoded LSBs).

As such, in the case of q=6, it can be guaranteed that there are D1 and D2 in the same group when $N \leq 2^6 - 8 - 1 = 55$. With a header length of q−3+5=6−3+5=8 bits, the efficiency of this coding arrangement may be calculated as:

$$\text{Efficiency} = \frac{qN}{qN+h} = \frac{6*55}{6*55+8} \approx 97.6\%$$

In some embodiments, the encoder 100 may implement an encoding function or a mapping from original values to encoded values in operation 550 using the techniques described above (e.g., based on Equation (2) or Equation (3)) or equivalents thereof. Similarly, the decoder 200 may implement a decoding function or mapping from the encoded values in operation 750 using the techniques described above (e.g., based on Equation (4) or Equation (5)) or equivalents thereof.

In some embodiments, the encoder 100 implements a two-stage mapping from the original values to encoded values in operation 550 using XOR (^) operations. In particular, in a first stage, of encoding, the word x to be encoded is XORed with D1 to compute an intermediate value y. In a second stage, one or more bits of y are XORed with one of the bits of y. In particular, x' is computed by selecting any single bit location z of the value of y calculated for D2 having a value of 1 and XORing the value at this bit location z with the bits of y at locations other than z and copying the bit at bit location z to the same location z of x'. Table 5 shows a specific example where D1 and D2 correspond to the values 9 and 11, respectively. Here, to perform the encoding of a particular word x, the word x is XORed with the value of D1 (9 or 001-001 in binary) to compute y (see the column labeled y=x^D1). For example, y is computed for the value x=7 by XORing 7 (000-111 in binary) with D1 (001-001) to arrive at y=001-110. Referring back to Table 5, D2 has exactly one bit location with value 1 (at z=2 or at the second least significant bit). Accordingly, x' is computed for x=7 by XORing the bit value at z=2 for its y (001-110, which has a value of 1 at z=2) with the bit values at all other locations of y (z≠2) to result in x'=110-011. As another example, for x=8, its corresponding value y is 000-001, which has a bit value of 0 at location 2. Accordingly, when XORing the bit values at bit locations of other than 2 to compute x', the values remain unchanged from the value of y, such that x'=000-001.

As such, aspects of embodiments of the present disclosure provide systems and methods for encoding data to reduce a maximum run length, thereby increasing the frequency of transitions on a data link. Increasing the frequency of transitions can, for example, improve a clock-data recovery process, thereby improving the quality of the connection between a sender and a receiver communicating over the data link. In more detail, some aspects of embodiments of the present disclosure relate to partitioning original data into data packets of N words, each word being q-bits long, encoding original data such that the encoded data is free of words that are all-zeroes or all-ones, thereby ensuring that a transition occurs at least once every q-bits. The encoding is performed based on a one-to-one mapping defined by two encoder values corresponding to two values that do not appear in the original data, where the two encoder values are transmitted as overhead for use by the decoder in defining a mapping for decoding the encoded data. Further improvements to efficiency result from decreasing the data overhead associated with the encoding process by compressing the encoder values.

While one example application of embodiments of the present disclosure is described above in the context of a serial link between a graphics controller and a display device, embodiments of the present disclosure are not limited thereto and may also be applied in other types of serial data links and serial data buses for connecting to other types of peripherals and computing devices, such as data storage devices (e.g., volatile or non-volatile memories, mass storage devices, and the like), external co-processing devices (e.g., external graphics processing units, artificial intelligence accelerators, and the like), network controllers, other computer systems, smartphones and other portable computing devices, and the like.

Embodiments of the present invention can be implemented in a variety of ways as would be appreciated by a person of ordinary skill in the art, and the term "processor" as used herein may refer to any computing device capable of performing the described operations, such as a programmed general purpose processor (e.g., an ARM processor) with instructions stored in memory connected to the general purpose processor, a field programmable gate array (FPGA), and a custom application specific integrated circuit (ASIC). Embodiments of the present invention can be integrated into a serial communications controller (e.g., a universal serial bus or USB controller), a graphical processing unit (GPU), an intra-panel interface, and other hardware or software systems configured to transmit and receive digital data.

While the present invention has been described in connection with certain example embodiments, it is to be understood that the invention is not limited to the disclosed embodiments, but, on the contrary, is intended to cover various modifications and equivalent arrangements included within the spirit and scope of the appended claims.

What is claimed is:

1. An encoder comprising a processing circuit configured to:
   receive original data;
   partition the original data into a plurality of original q-bit words;
   assemble a data packet comprising N original q-bit words from the plurality of original q-bit words;
   identify a first encoder value D1 and a second encoder value D2 that are absent from the values of the N original q-bit words;
   encode the N original q-bit words based on a one-to-one mapping from q-bit original values to q-bit encoded values based on the first encoder value D1 and the second encoder value D2 to generate N encoded q-bit payload words, the N encoded q-bit payload words being free of words that are all-zeroes and free of words that are all-ones;
   generate a key representing the first encoder value D1 and the second encoder value D2; and
   transmit the key and the N encoded q-bit payload words.

2. The encoder of claim 1, wherein the processing circuit is configured to encode a q-bit original value x as a q-bit encoded value x' based on a comparison of the q-bit original value x with the first encoder value D1 and the second encoder value D2.

3. The encoder of claim 1, wherein the first encoder value D1 and the second encoder value D2 have matching prefixes of length q−1,
   wherein a computed value E corresponds to q−1 most significant bits of D1, and
   wherein the processing circuit is configured to generate the key, the key comprising the computed value E representing the first encoder value D1 and the second encoder value D2.

4. The encoder of claim 3, wherein the processing circuit is configured to encode a q-bit original value x as a q-bit encoded value x' by computing an exclusive or operation on the original value and the computed value E.

5. The encoder of claim 1, wherein a space of $2^q$ values of the q-bit original values is divided into a plurality of groups, each group comprising a plurality of different consecutive q-bit original values, and
   wherein the processing circuit is configured to identify the first encoder value D1 and the second encoder value D2 by:
      identifying a group having two q-bit original values that are absent from the values of the values of the N original q-bit words; and
      identifying one of the two q-bit original values in the identified group as the first encoder value D1 and another of the two q-bit original values in the identified group as the second encoder value D2.

6. The encoder of claim 5, wherein the space of $2^q$ values of the q-bit original values is divided into G groups, and
   wherein N is less than or equal to $2^q - G - 1$.

7. The encoder of claim 5, wherein each group comprises up to three values, and
   wherein the processing circuit is configured to generate a computed encoder value E representing the first encoder value D1 and the second encoder value D2 by selecting a middle value of a group of the G groups that includes the first encoder value D1 and the second encoder value D2.

8. The encoder of claim 7, wherein the processing circuit is configured to encode a q-bit original value x as a q-bit encoded value x' based on a comparison of the q-bit original value x and the computed encoder value E.

9. The encoder of claim 5, wherein each group comprises 2r values,
   wherein the first encoder value D1 and the second encoder value D2 share q−r most significant bits, and
   wherein the processing circuit is configured to generate the key representing the first encoder value D1 and the second encoder value D2 by:
      encoding r least significant bits of D1 and r least significant bits of D2 using 2r−1 bits to generate a least significant bits code, the least significant bits code having at least one transition; and
      concatenating the q−r most significant bits with the least significant bits code.

10. The encoder of claim 9, wherein the processing circuit is further configured to generate the key representing the first encoder value D1 and the second encoder value D2 by dividing the q−r most significant bits into a first part and a second part, and
   wherein the least significant bits code is concatenated between the first part and the second part of the q−r most significant bits.

11. The encoder of claim 1, wherein the processing circuit is configured to transmit a data packet comprising:
   the N encoded q-bit payload words; and
   a header comprising the key.

12. A decoder comprising a processing circuit configured to:
   receive a key and N encoded q-bit payload words;
   decode a first encoder value D1 and a second encoder value D2 from the key; and decode the N encoded q-bit payload words based on a one-to-one mapping from q-bit encoded values to q-bit original values based on the first encoder value D1 and the second encoder value D2 to generate N decoded original q-bit words.

13. The decoder of claim 12, wherein the processing circuit is configured to decode a q-bit encoded value x' to a q-bit decoded value x based on a comparison of the q-bit encoded value x' with the first encoder value D1 and the second encoder value D2.

14. The decoder of claim 12, wherein the key comprises a q−1 bit value E,
wherein the processing circuit is configured to decode the first encoder value D1 by setting q−1 most significant bits of D1 to E and a least significant bit of D1 to 0, and
wherein the processing circuit is configured to decode the second encoder value D2 by setting q−1 most significant bits of D2 to E and a least significant bit of D2 to 1.

15. The decoder of claim 12, wherein the key comprises a q−1 bit value E, and
wherein the processing circuit is configured to decode a q-bit encoded value x' to a q-bit original value x based on a result of an exclusive or operation performed on the q-bit encoded value x' and the q−1 bit value E.

16. The decoder of claim 12, wherein a space of $2^q$ values of the q-bit original values is divided into a plurality of groups, each group comprising a plurality of different consecutive q-bit original values,
wherein each group comprises up to three values, and
wherein the processing circuit is configured to decode the first encoder value D1 and the second decoder value D2 based on a result of a modulo operation on the q−1 bit value E.

17. The decoder of claim 16, wherein the processing circuit is configured to decode a q-bit encoded value x' to a q-bit original value x based on a comparison of the q-bit encoded value x' and the q−1 bit value E.

18. The decoder of claim 12, wherein a space of $2^q$ values of the q-bit original values is divided into a plurality of groups, each group comprising $2^r$ different consecutive q-bit original values,
wherein the first encoder value D1 and the second encoder value D2 share q−r most significant bits, and
wherein the processing circuit is configured to decode the first encoder value D1 and the second encoder value D2 from the key by:
reading an 2r−1 bit least significant bits code from the header;
decoding the least significant bits code to first least significant bits and second least significant bits;
reading q−r most significant bits from a portion of the header;
concatenating the q−r most significant bits with the first least significant bits to decode the first encoder value D1; and
concatenating the q−r most significant bits with the second least significant bits to decode the second encoder value D2.

19. The decoder of claim 12, wherein the decoder is configured to receive a data packet comprising:
the N encoded q-bit payload words; and
a header comprising the key.

* * * * *

UNITED STATES PATENT AND TRADEMARK OFFICE
CERTIFICATE OF CORRECTION

PATENT NO. : 11,967,973 B2
APPLICATION NO. : 17/389146
DATED : April 23, 2024
INVENTOR(S) : Aliazam Abbasfar It is certified that error appears in the above-identified patent and that said Letters Patent is hereby corrected as shown below:

In the Specification

In Column 20, Line 39, in Claim 9, delete "2r" and insert -- $2^r$ --.

Signed and Sealed this
Twentieth Day of August, 2024

Katherine Kelly Vidal
*Director of the United States Patent and Trademark Office*